(12) United States Patent
Choi et al.

(10) Patent No.: US 10,739,498 B2
(45) Date of Patent: Aug. 11, 2020

(54) COVER WINDOW FOR DISPLAY DEVICE AND DISPLAY DEVICE INCLUDING THE SAME

(71) Applicant: Samsung Display Co., Ltd., Yongin-si, Gyeonggi-do (KR)

(72) Inventors: Min-Hoon Choi, Seoul (KR); Sang-Il Park, Yongin-si (KR); Heon Jung Shin, Hwaseong-si (KR); Jeoung Sub Lee, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 16/015,262

(22) Filed: Jun. 22, 2018

(65) Prior Publication Data
US 2019/0094420 A1    Mar. 28, 2019

(30) Foreign Application Priority Data

Sep. 25, 2017  (KR) .......................... 10-2017-0123592

(51) Int. Cl.
| | |
|---|---|
| *G02B 5/02* | (2006.01) |
| *G02B 1/118* | (2015.01) |
| *H01L 51/52* | (2006.01) |
| *H05K 5/03* | (2006.01) |
| *H05K 5/00* | (2006.01) |

(52) U.S. Cl.
CPC ............ *G02B 1/118* (2013.01); *G02B 5/0242* (2013.01); *G02B 5/0247* (2013.01); *H01L 51/5246* (2013.01); *H05K 5/0017* (2013.01); *H05K 5/03* (2013.01); *H01L 51/5237* (2013.01); *H01L 51/5281* (2013.01); *H01L 2251/5338* (2013.01); *H01L 2251/5369* (2013.01)

(58) Field of Classification Search
CPC .... G02B 1/118; G02B 5/0242; G02B 5/0247; H01L 51/5246; H01L 51/5237; H01L 51/5281; H01L 2251/5338; H01L 2251/5369; H05K 5/0017; H05K 5/03
See application file for complete search history.

(56) References Cited

U.S. PATENT DOCUMENTS

| | | | | |
|---|---|---|---|---|
| 8,916,892 B2* | 12/2014 | Jo | ....................... | H01L 27/1218 257/98 |
| 2011/0195239 A1* | 8/2011 | Takane | ............. | B29D 11/00865 428/206 |
| 2013/0140534 A1* | 6/2013 | Lai | ...................... | H01L 51/5262 257/40 |
| 2013/0209678 A1* | 8/2013 | Sun | ........................ | G02B 1/111 427/165 |

(Continued)

FOREIGN PATENT DOCUMENTS

| | | |
|---|---|---|
| JP | 5458694 B2 | 1/2014 |
| KR | 1020030030351 A | 4/2003 |

(Continued)

*Primary Examiner* — Cara E Rakowski
*Assistant Examiner* — Magda Cruz
(74) *Attorney, Agent, or Firm* — Cantor Colburn LLP

(57) ABSTRACT

A cover window includes: a base film disposed on a display panel of a display device which displays an image with light; and porous nanoparticles embedded in the base film at a side of the base film opposite to that at which the display panel is disposed.

18 Claims, 12 Drawing Sheets

(56) References Cited

U.S. PATENT DOCUMENTS

| | | | | |
|---|---|---|---|---|
| 2013/0215513 A1* | 8/2013 | Liang | ............... | G02B 1/11 |
| | | | | 359/601 |
| 2014/0249526 A1* | 9/2014 | Kotov | ............... | H01B 1/22 |
| | | | | 606/41 |
| 2015/0064405 A1* | 3/2015 | Koch, III | ............... | G02B 1/118 |
| | | | | 428/147 |
| 2015/0097165 A1* | 4/2015 | Setz | ............... | H01L 51/448 |
| | | | | 257/40 |
| 2015/0107582 A1* | 4/2015 | Jin | ............... | F24S 20/20 |
| | | | | 126/676 |

FOREIGN PATENT DOCUMENTS

| | | | |
|---|---|---|---|
| KR | 1020130092565 A | | 8/2013 |
| KR | 1020160046915 A | | 4/2016 |
| KR | 1020160134017 A | | 11/2016 |
| KR | 1020170029844 A | | 3/2017 |
| WO | 2012022983 A1 | | 2/2012 |
| WO | 2015031600 A1 | | 3/2015 |

\* cited by examiner

COVER WINDOW FOR DISPLAY DEVICE AND DISPLAY DEVICE INCLUDING THE SAME

This application claims priority to Korean Patent Application No. 10-2017-0123592 filed on Sep. 25, 2017, and all the benefits accruing therefrom under 35 U.S.C. § 119, the entire contents of which are incorporated herein by reference.

BACKGROUND

(a) Field

The present disclosure relates to a cover window of a display device and a display device including the same.

(b) Description of the Related Art

Various mobile electronic devices such as mobile phones, navigators, digital cameras, e-books, portable game consoles, and various other devices to which a liquid crystal display ("LCD") or an organic light emitting diode ("OLED") display is applied as a display device, have been used.

A general display device used for the mobile devices includes a cover window which is transparently configured so that a user can view a display area in the front of a display panel. The window has strength against external impact so as to protect a display panel and the like in the device since the window is disposed at the outmost side of the device.

Further, instead of a conventional input method in which a switch or keyboard is used as an input device, a structure employing a touch panel having a display screen integrated therein has widely spread. Thus, since the surface of the cover window is more frequently contacted with a finger or the like, the cover window requires higher strength.

Research has been actively conducted on a flexible display device, and the cover window applied to the flexible display device has flexibility so as to be bendable along with other components of the display device.

SUMMARY

The invention has been made in an effort to provide a cover window for a display device, which can reduce reflectance and has excellent wear resistance and impact resistance, and a display device including the same. A cover window according to an exemplary embodiment includes: a base film disposed on a display panel of a display device which displays an image with light; and porous nanoparticles embedded in the base film.

The porous nanoparticles may protrude from a surface of the base film.

The base film may have elasticity lower than that of the porous nanoparticles.

Each of the porous nanoparticles may include a plurality of pores defined therein, and at an embedded portion of the porous nanoparticles, a material of the base film may extend into the pores of the porous nanoparticles to contact the porous nanoparticles in the pores thereof.

A dimension of each of the porous nanoparticles may be about 30 nanometers (nm) to about 1 micrometer (μm).

In a direction perpendicular to the side of the base film, about 5% to about 90% of a dimension of each porous nanoparticle may be embedded in the base film.

Each porous nanoparticle embedded in the base film at the side of the base film may include: a first portion thereof which is exposed outside the cover window, and a second portion thereof which is embedded in the base film, and in a direction perpendicular to the side of the base, the cover window may further include: a first thickness region defined by a maximum dimension among the first portions of the porous nanoparticles; a second thickness region defined by a maximum dimension among the second portions of the porous nanoparticles; and a third thickness region where no portion of the porous nanoparticles is disposed in the base film.

The first thickness region, the second thickness region and the third thickness region may respectively define refractive indices within the cover window which are different from each other, and the refractive indices may increase within the cover window in the order of the first thickness region, the second thickness region and the third thickness region thereof.

The first thickness region, the second thickness region and the third thickness region of the cover window may be disposed in order along a thickness of the cover window, in a direction toward the display panel, a refractive index of the first thickness region may about 1.2 to about 1.5, a refractive index of the third thickness region may be about 1.5 to about 1.7, and a refractive index of the second thickness region may be greater than the refractive index of the first thickness region and smaller than the refractive index of the third thickness region.

The porous nanoparticles embedded in the base film may define first porous nanoparticles each including a first portion thereof which is exposed outside the cover window, and a second portion thereof which is embedded in the base film, and the cover window may further include second porous nanoparticles each being fully embedded in the base film.

A display device according to an exemplary embodiment includes: a display panel which displays an image with light; and a cover window through which the light from the display panel passes to outside the display device. The cover window includes: a base film disposed overlapping the display panel which displays the image with the light, and porous nanoparticles embedded in the base film at a side of the base film.

The porous nanoparticles embedded in the base film may define first porous nanoparticles each protruding from a surface of the base film. An adhesive layer may be provided between the cover window and the display panel, and second the porous nanoparticles may contact the base film and the adhesive layer.

According to one or more exemplary embodiment, a cover window for a display device, which can reduce reflectance and has excellent wear resistance and impact resistance, and a display device including the same, can be provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
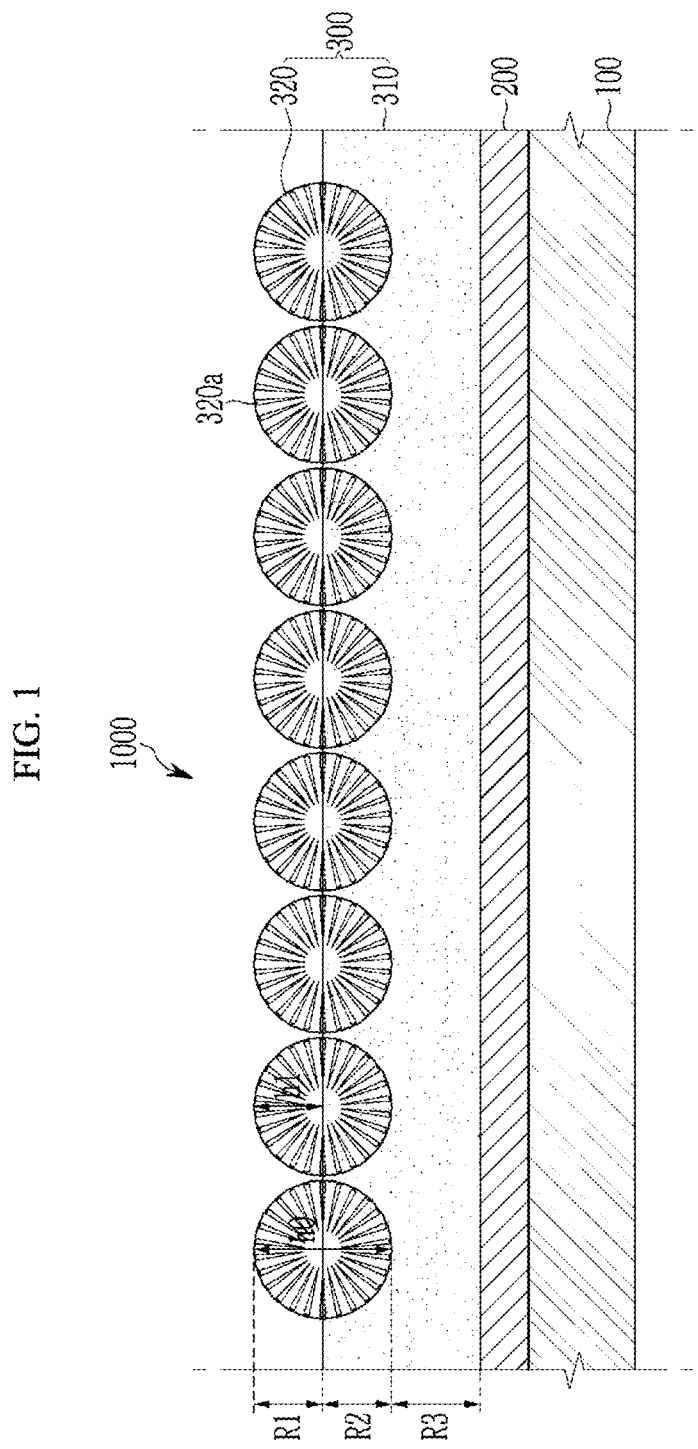
FIG. 1 is a schematic cross-sectional view of an exemplary embodiment of a display device according to the invention.

Hereinafter, exemplary embodiments of the invention will be described in more detail with reference to the accompanying drawings. As those skilled in the art would realize, the described embodiments may be modified in various different ways, all without departing from the spirit or scope of the invention.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

The word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

In this specification, the phrase "on a plane" means viewing a target portion from the top, and the phrase "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a cover window and a display device including the same according to an exemplary embodiment of the invention will be described. FIG. 1 is a schematic cross-sectional view of an exemplary embodiment of a display device according to the invention.

As shown in FIG. 1, a display device 1000 according to an exemplary embodiment includes a display panel 100, and a cover window 300 that is disposed on the display panel 100. An adhesive layer 200 is disposed between the display panel 100 and the cover window 300.

The display device 1000 and elements thereof may be disposed in a plane parallel to a plane defined by the first and second directions which cross each other (e.g., horizontal direction in FIG. 1). A thickness of the display device 1000 and elements thereof may be taken in a third direction which crosses each of the first and second directions (e.g., vertical in FIG. 1).

The display panel 100 may be flexible, stretchable, bendable or rollable. That is, the display panel 100 and components thereof can be deformed so as to be flexible. The display panel 100 generates and displays an image with light. The display panel 100 includes a display area at which the image is displayed and a non-display area at which the image is not displayed. The light may be generated within the display panel or light generated external to the display panel may be provided thereto to display the image.

The display panel 100 may be provided as an organic light emitting panel. The display panel 100 may include a (base) substrate, a switching element such as a thin film transistor provided in plurality and an electrode provided in plurality and connected to the thin film transistor. The thin film transistors and the electrodes are disposed on the substrate.

The display panel 100 is provided as an organic light emitting panel in the exemplary embodiment, but the invention is not limited thereto. The display panel 100 according to another exemplary embodiment may be provided as a liquid crystal panel, an electrophoretic display panel, an electro-wetting display panel, and the like.

An optical layer (not shown) may be provided on (e.g., external to) the display panel 100. Alternatively, the optical layer may be embedded in the display panel 100. The optical layer may include a phase delay layer, a polarization layer, and the like.

The adhesive layer 200 may include an optically clear adhesive ("OCA"), an optically clear resin ("OCR"), a pressure sensitive adhesive ("PSA"), and the like. The adhesive layer 200 is disposed between the display panel 100 and the cover window 300, and serves to bond the display panel 100 and the cover window 300 to each other.

The cover window 300 may be disposed on the display panel 100 and is thus bonded to the display panel 100 by the adhesive layer 200. The cover window 300 may form an outermost surface of the display device 1000. The cover window 300 may protect the display panel 100 from an external environment or impact thereto. The cover window 300 may have a thickness which is about 1 micrometer (μm) or more and about 500 μm or less. That is, between about 1 μm and about 500 μm. The thickness may be a maximum thickness of the cover window 300.

The cover window 300 includes a base film 310, and a porous nanoparticle 320 partially embedded into one side (surface) of the base film 310.

The base film 310 may include at least one of polyimide ("PI"), colorless polyimide ("CPI"), polyamide imide ("PAI"), polyether ether ketone ("PEEK") and polyether imide ("PEI").

A plurality of porous nanoparticles 320 may be included in the cover window 300 and disposed partially embedded into one side (surface) of the base film 310. Each single porous nanoparticle 320 may be a porous particle including a pore 320a provided in plurality. In an exemplary embodiment, for example, the porous nanoparticle 320 may be a silica porous particle or an alumina porous particle.

The porous nanoparticle 320 may be partially embedded into the base film 310 at a surface thereof. As shown in FIG. 1, each porous nanoparticle 320 may be partially protruded from one side of the base film 310. The protruded portions of the porous nanoparticle 320 may contact or be exposed to the atmosphere external to the display device 1000. The protruded portion of the porous nanoparticle 320 may protect the cover window 300 and/or the display panel 100 from external impact or abrasion thereto.

The porous nanoparticle 320 has a diameter h0 of about 30 nanometers (nm) to about 1 μm. When the diameter of the porous nanoparticle 320 exceeds about 1 μm, the porous nanoparticles 320 may be viewed by a user, and when the diameter of the porous nanoparticle 320 is less than 30 nm, improvement of wear resistance and impact resistance may be insignificant. The diameter h0 of the porous nanoparticle 320 may be a maximum dimension thereof.

Each porous nanoparticle 320 may have a shape in which about 5% to about 90% of a dimension of the porous nanoparticle 320, such as the diameter thereof, is embedded in the base film 310. Specifically, a ratio of a height h1 of an externally-exposed portion of the porous nanoparticle 320 to the entire diameter h0 of the porous nanoparticle 320 may be about 0.05 to about 0.9. The heights h0 and h1 may be defined in a direction perpendicular to the surface of the base film 310 from which the porous nanoparticle 320 is protruded. When the ratio of the height (h0/h1) is less than 0.05, improvement of wear resistance and impact resistance by the porous nanoparticles 320 may be insignificant, and when the ratio is greater than 0.9, the base film 310 cannot strongly fix the porous nanoparticles 320 at positions thereof within the cover window 300 such that reliability of the cover window 300 may be decreased.

Referring to FIG. 1, the cover window 300 may include a first region R1 where the porous nanoparticles 320 are exposed to outside the base film 310, a second region R2 where the porous nanoparticles 320 are embedded in the base film 310, and a third region R3 that corresponds to a portion of the base film 310 where the porous nanoparticles 320 are not located within the base film 310.

In the first region R1, the pores 320a of the porous nanoparticles 320 may contact or be exposed to the external environment (e.g., the atmosphere) outside the display device 1000.

In the second region R2, a material that forms the base film 310 may be filled in the pores 320a of the porous nanoparticles 320. That is, the material of the base film 310 disposed outside the porous nanoparticles 320 may extend into the pores 320a. The porous nanoparticles 320 and the base film 310 may directly contact each other in the pores 320a. Since the material that forms the base film 310 is filled in the pores 320a of each porous nanoparticle 320, the base film 310 and the porous nanoparticles 320 can be bonded to each other without using an additional adhesive layer. The porous nanoparticles 320 and the base film 310 may be physically or chemically bonded to each other.

The cover window 300 according to the exemplary embodiment may have a structure of which a refractive index thereof is gradually changed according to a location within the cover window 300. In an exemplary embodiment, for example, the porous nanoparticle 320 may have a refractive index of about 1.3 to about 1.5 and the base film 310 may have a refractive index of about 1.5 to about 1.7.

A refractive index n1 of the cover window 300 at the first region R1 where the pores 320a at a portion of the porous nanoparticles 320 are exposed to the external environment outside the display device 1000 may be lower than a refractive index of another portion of the porous nanoparticle 320. A difference in refractive indices is due to a refractive index being formed between the exposed pores 320a of the porous nanoparticle 320 and the external atmosphere. In an exemplary embodiment, the portion of the porous nanoparticle 320 where the pores 320a are not exposed to the external environment may have a refractive index of about 1.3 to about 1.5, a refractive index of the atmosphere may be about 1, and the first region R1 at which the pores 320a of the porous nanoparticles 320 are exposed to the external environment may have a refractive index of about 1.2 to about 1.5. In an exemplary embodiment, the refractive index of the first region R1 where the pores 320a are exposed to the external environment is between the refractive index of the atmosphere and the refractive index of another portion of the porous nanoparticle 320 such as where the pores 320a are not exposed to the external environment.

A refractive index n3 of the third region R3 that corresponds to the portion of the base film 310 where the porous nanoparticles 320 are not located may be about 1.5 to about 1.7.

A refractive index n2 of the second region R2 where the porous nanoparticles 320 are embedded in the base film 310 may be greater than the refractive index n1 of the first region R1 and smaller than the refractive index n3 of the third region R3.

The refractive index of the cover window 300 according to the exemplary embodiment may increase as a distance to the display panel 100 decreases, such as from a region of the cover window 300 that is adjacent or closest to the outside environment. The refractive index of the cover window 300 may be gradually (continuously) increased or increased in steps as a distance to the display panel 100 from the region adjacent to the outside decreases, but this is not restrictive.

Elasticity of the base film 310 may be lower than that of the porous nanoparticle 320. A modulus of elasticity of the base film 310 may be lower than that of the porous nanoparticle 320. The base film 310 enables the display device to be flexible, and the porous nanoparticles 320 having relatively high strength can improve wear resistance and impact resistance with respect to the outermost side of the cover window 300, exposed to a user.

In the present specification, the plurality of porous nanoparticles are embedded with a constant height, respectively, but this is not restrictive. The plurality of porous nanoparticles may be respectively embedded with different heights in the base film such that the porous nanoparticles may be exposed with different heights outside of the base film.

The cover window 300 according to the exemplary embodiment of the present invention may be formed by any of a number of manufacturing methods, and the manufacturing method described in the present specification is exemplarily provided.

In an exemplary embodiment, the base film 310 is provided in a semi-hardened state. Porous nanoparticles 320 that are uniformly dispersed on an auxiliary substrate, such as being separate from the prepared base film, are prepared.

The auxiliary substrate having the porous nanoparticles 320 dispersed thereon is bonded to the semi-hardened base film 310 at a side thereof, such that the porous nanoparticles 320 can be partially embedded in the base film 310 at the side thereof.

The base film 310 is hardened such that the cover window 300 is formed. In an exemplary embodiment, the semi-hardened base film 310 having the porous nanoparticles 320 embedded therein, is hardened. The auxiliary substrate on which the porous nanoparticles 320 are dispersed can be separated from the porous nanoparticles 320 before or after the base film 310 is hardened.

According to another exemplary embodiment, a base film 310 in a hardened state may be prepared. In addition, a porous nanoparticle solution that includes the porous nanoparticles 320 dispersed in a solvent is prepared.

The porous nanoparticle solution is applied onto the base film 310 such as on a side thereof, and the solvent is volatilized from the porous nanoparticle solution on the base film 310. The base film 310 having thereon the porous nanoparticle solution is softened such as through stimulation such as with vapor or plasma. In exemplary embodiments, the base film 310 may be softened after the solvent is volatilized from the porous nanoparticle solution.

The porous nanoparticles 320 from within the volatilized porous nanoparticle solution disposed on the side of the softened base film 310 may be partially embedded into the softened base film 310. After the porous nanoparticles 320 are partially embedded into the softened base film 310, the base film 310 is hardened such that the cover window 300 according to one or more exemplary embodiment of the invention can be formed.

Figure 2:
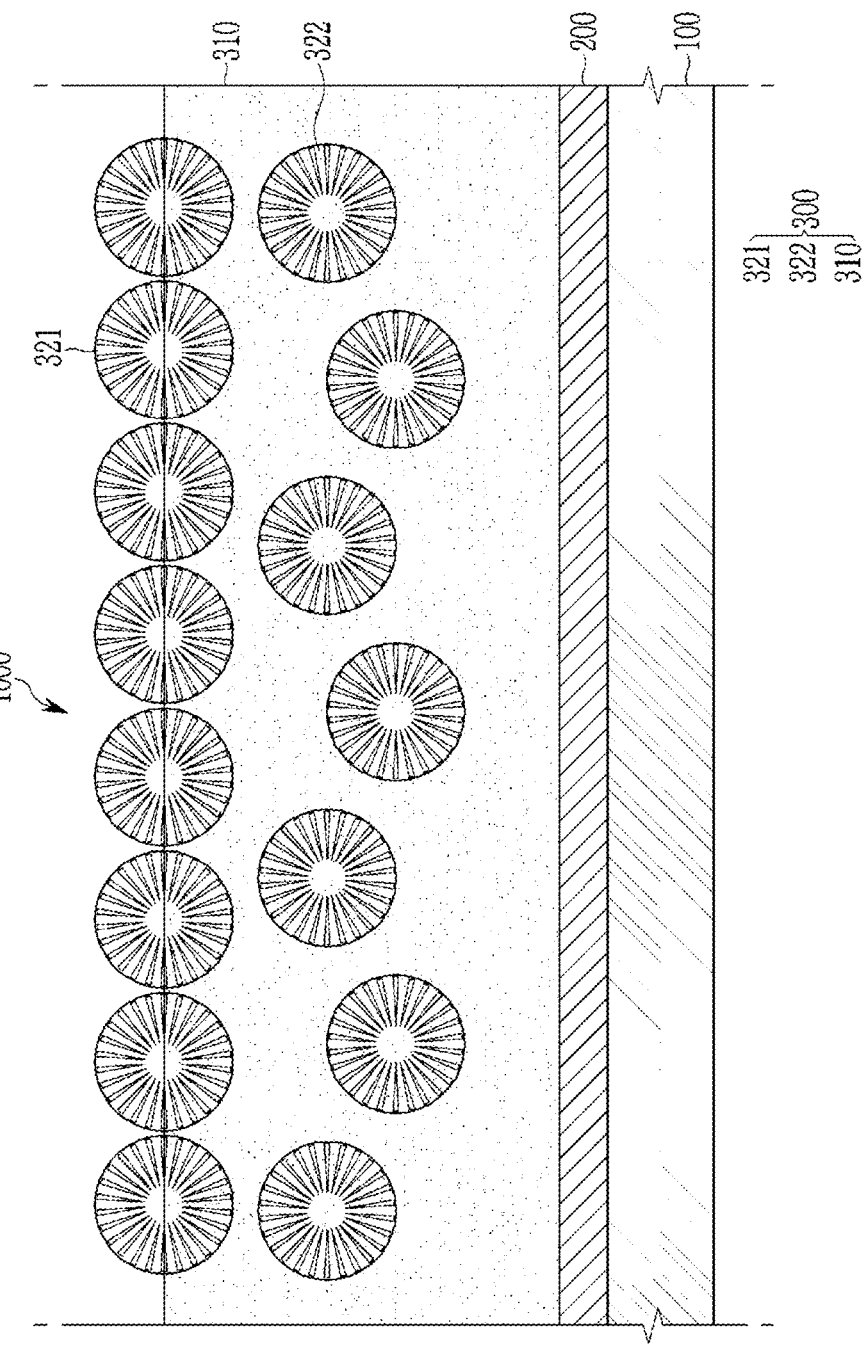
FIG. 2, FIG. 3 and FIG. 4 are schematic cross-sectional views of modified exemplary embodiments of the display device FIG. 1.
Figure 3:
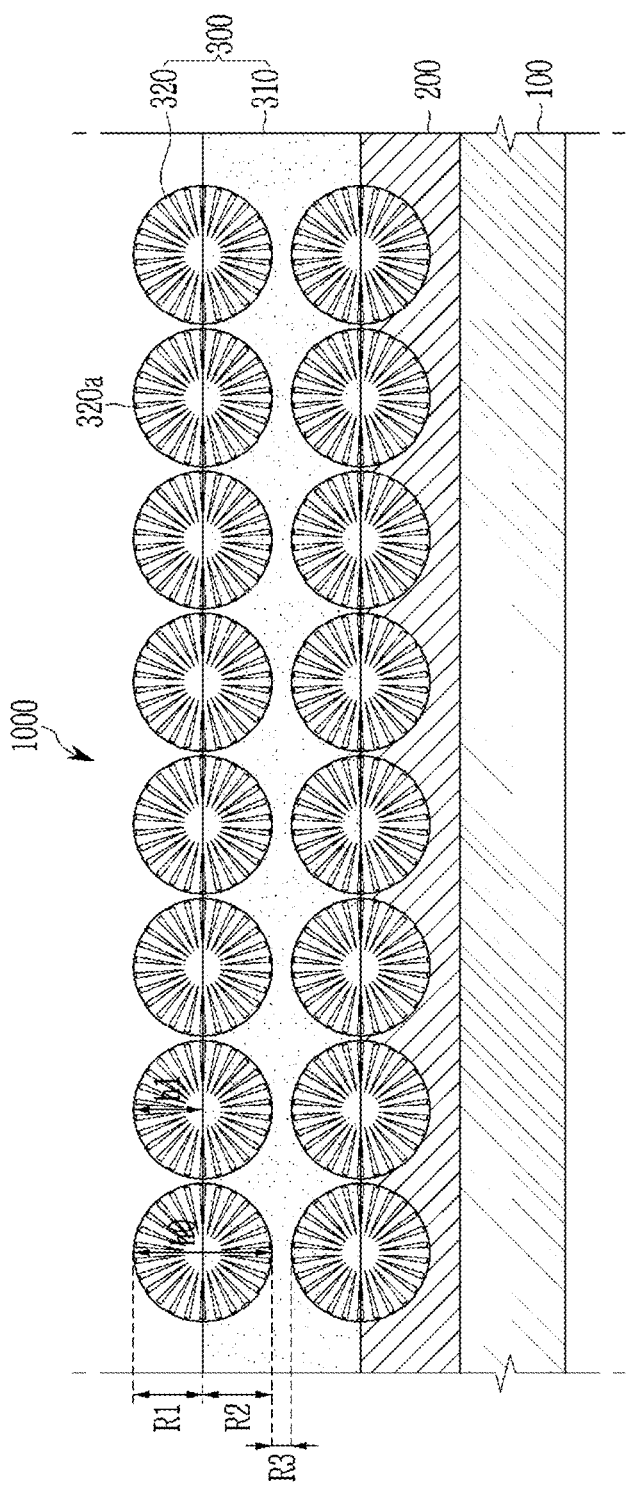
Figure 4:
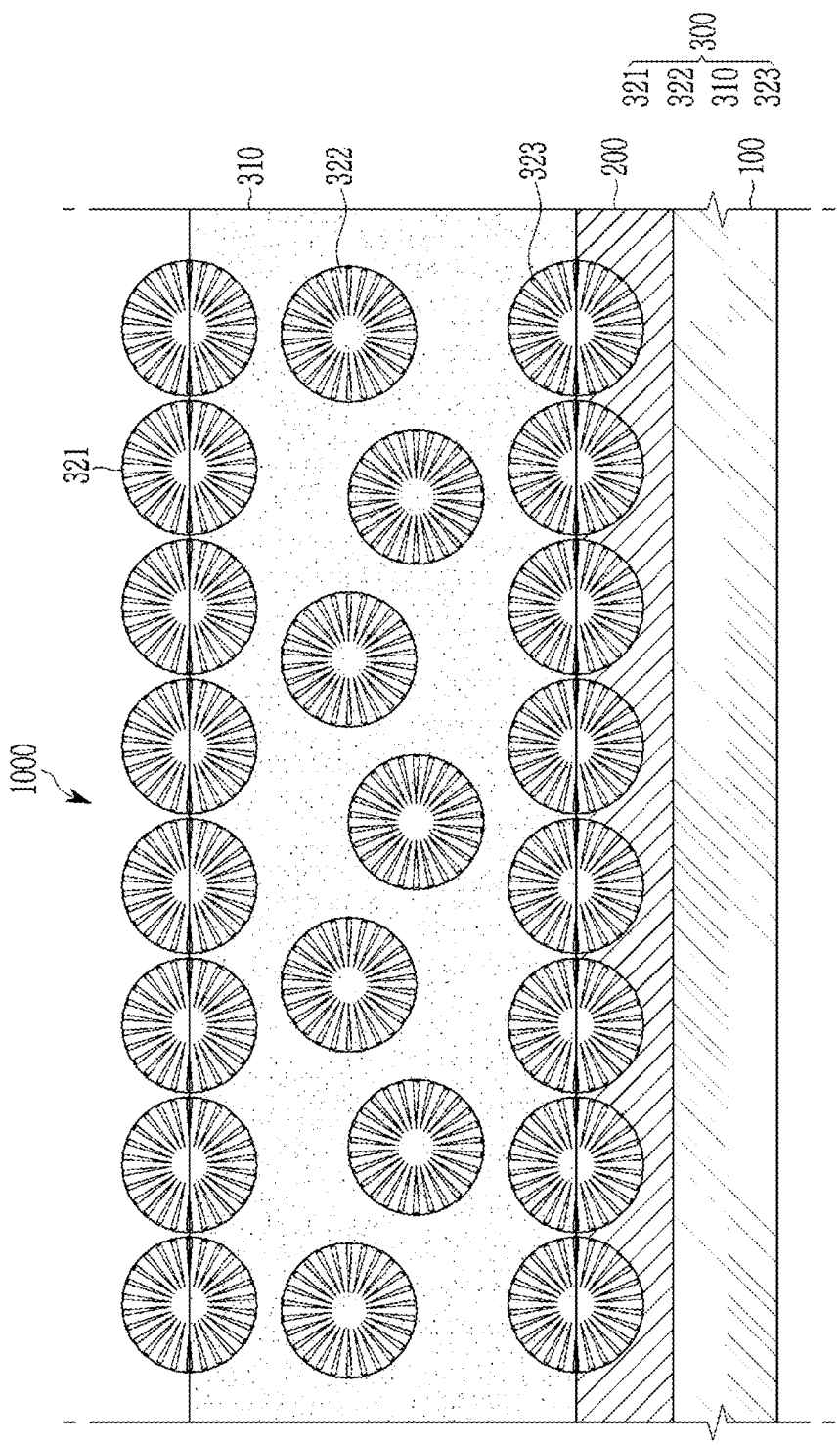

Hereinafter, cover windows 300 according to exemplary variations of the invention will be described with reference to FIG. 2, FIG. 3 and FIG. 4, respectively. FIG. 2, FIG. 3 and FIG. 4 are schematic cross-sectional views of modified exemplary embodiments of the display device of FIG. 1, according to the invention. A description of the same components as those described in FIG. 1 may be omitted.

Referring to FIG. 2, a cover window 300 according to the exemplary variation of FIG. 1 includes a first porous nanoparticle 321 provided in plurality each partially protruded from a surface of a base film 310, and a second porous nanoparticle 322 provided in plurality each fully embedded into the base film 310. The first porous nanoparticles 321 may form a first single layer in the cover window 300, and the second porous nanoparticles 322 may form a second single layer in the cover window 300. A layer of the base film 310 having no porous nanoparticles therein may be disposed between the first and second layers of the porous nanoparticles.

The first porous nanoparticles 321 and the second porous nanoparticle 322 may have the same structure as or similar structure to each other. Each of the first and second porous nanoparticles 321 and 322 may include pores. In an exemplary embodiment, for example, the first and second nanoparticles 321 and 322 may be silica porous particles or alumina porous particles.

The first porous nanoparticles 321 may be partially embedded into the base film 310. As shown in FIG. 2, each of the first porous nanoparticles 321 may be partially protruded from one side of the base film 310, to be exposed outside of the cover window 300 and outside of the display device 1000.

The first porous nanoparticles 321 may have a shape for which about 5% to about 90% of a dimension such as a diameter of the first porous nanoparticles 321 may be embedded in the base film 310. A remaining dimension of the first porous nanoparticles 321 may be protruded from the base film 310.

The second porous nanoparticles 322 may be fully embedded in the base film 310. As shown in FIG. 2, respective pores of each of the full-embedded second porous nanoparticles 322 may be filled with a material that forms the base film 310.

Referring to FIG. 3, a cover window 300 according to the present exemplary variation may include porous nanoparticles 320 that protrude from opposite sides of a base film 310. The opposite sides of the base film 310 may be two sides that overlap a display panel 100.

The porous nanoparticles 320 may protrude to an outer side of the cover window 300, which is adjacent to a user, or may protrude in a direction of an adhesive layer 200 that is adjacent to the display panel 100 to be embedded. The porous nanoparticles 320 protruded in the direction of the adhesive layer 200 may be bonded to the adhesive layer 200. A material that forms the adhesive layer 200 may be provided inside of the pores of the porous nanoparticles 320. That is, the porous nanoparticles 320 and the adhesive layer 200 may contact each other in the pores.

The first porous nanoparticles 320 may form first and second single layers within the cover window 300. A layer of the base film 310 having no porous nanoparticles therein (third region R3 in FIG. 3) may be disposed between the first and second layers of the porous nanoparticles.

The exemplary variation may be the same as or similar to the exemplary embodiment of FIG. 1, except for the porous nanoparticles 320 that protrude toward the adhesive layer 200.

Referring to FIG. 4, a cover window 300 according to the present exemplary variation may include first porous nanoparticles 321 protruded from one side of a base film 310, which is adjacent to a user, second porous nanoparticles 322 fully embedded in the base film 310, and third porous nanoparticles 323 protruded from one side of the base film 310, which is adjacent to an adhesive layer 200.

The cover window 300 according to the present exemplary variation may further include the third porous nanoparticles 323 compared to the exemplary embodiment of FIG. 2. The first porous nanoparticles 321 and the second porous nanoparticles 322 may be the same as the first porous nanoparticles 321 and the second porous nanoparticles 322 of FIG. 2.

The third porous nanoparticles 323 may contact the adhesive layer 200. Specifically, a material that forms the adhesive layer 200 may be provided inside the pores of the third porous nanoparticles 323. The third porous nanoparticles 323 and the adhesive layer 200 may directly contact each other through the pores.

Figure 5:
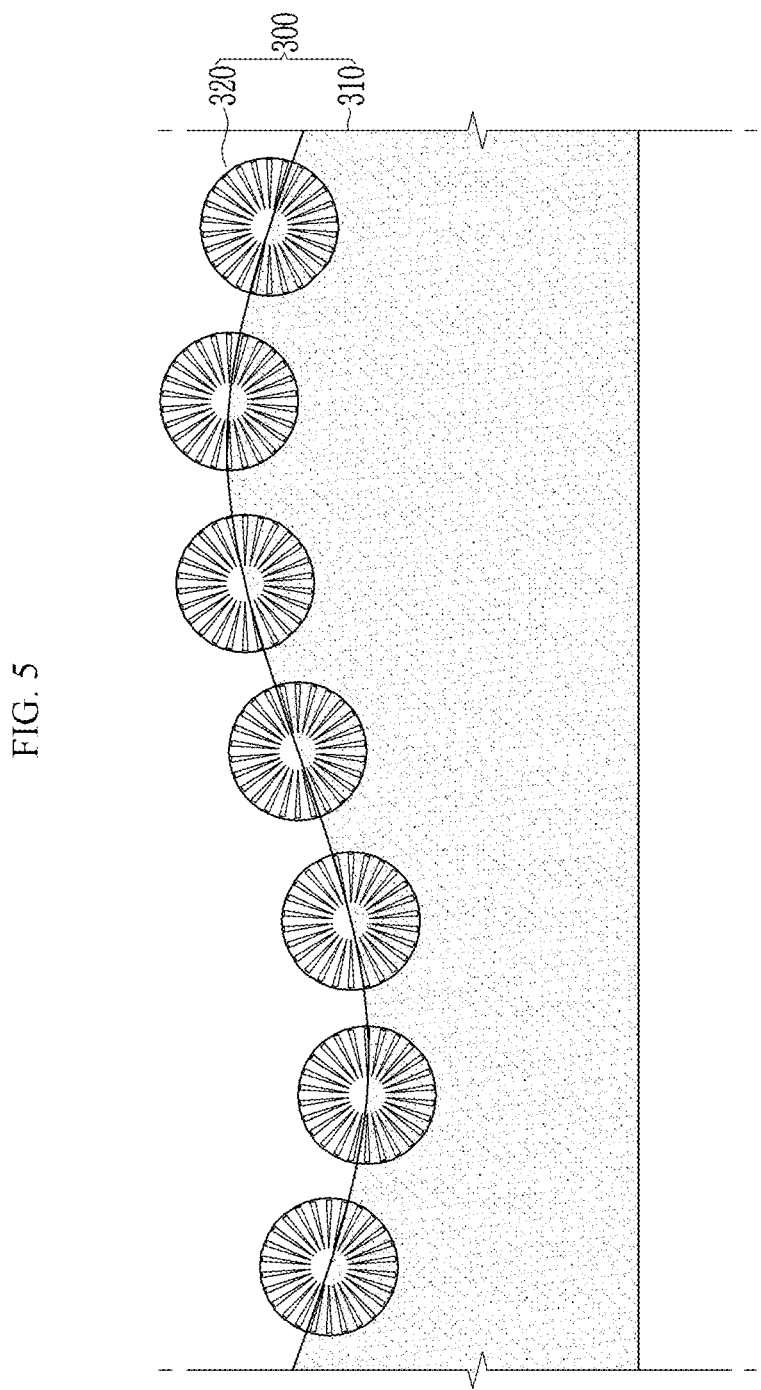
FIG. 5 is a schematic cross-sectional view of an exemplary embodiment of a curved cover window of a display device according to the invention.

Hereinafter, a cover window having a curved shape will be described with reference to FIG. 5. FIG. 5 is a schematic cross-sectional view of an exemplary embodiment of a curved cover window of a display device. The adhesive layer 200 and the display panel 100 are omitted for convenience of description.

A display device according to the present exemplary embodiment may be flexible, stretchable, foldable, bendable or rollable. The display device may be partially curved or deformed to provide a non-flat surface.

When the display device is partially curved, the cover window 300 may be shown as in FIG. 5. The base film 310 having excellent flexibility may be curved or deformed, and the porous nanoparticles 320 having relatively low flexibility and a high modulus can be arranged along a curve such that adjacent porous nanoparticles 320 may be separated from each other. That is, the arrangement of the porous nanoparticles 320 along the exposed outer surface of the base film 310 follow a profile or shape of the exposed outer surface.

According to the present exemplary embodiment, even when the cover window 300 is flexible, wear resistance and impact resistance can be provided together with flexibility without causing separation of or damage to any configuration.

Figure 6:
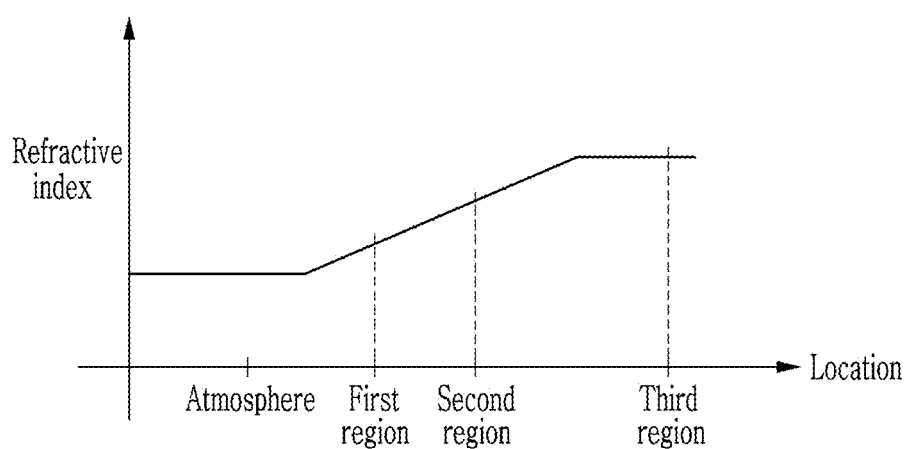
FIG. 6 and FIG. 7 are graphs that show a refractive index of exemplary embodiments of the cover window according to the invention.
Figure 7:
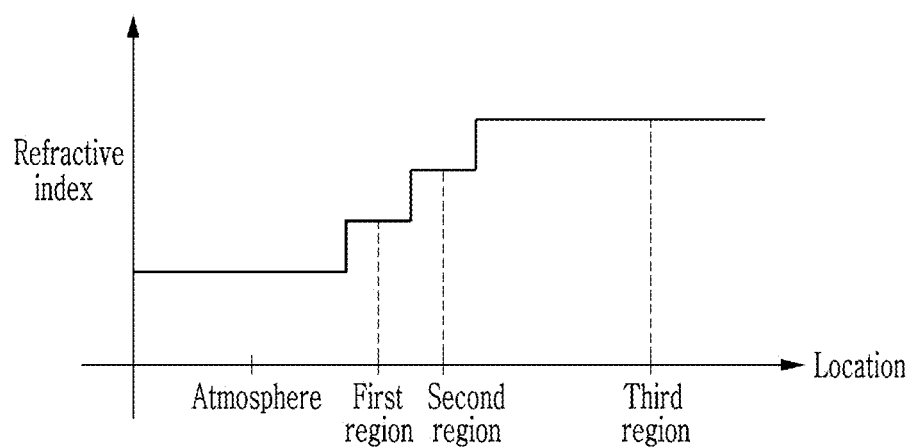
Figure 8:
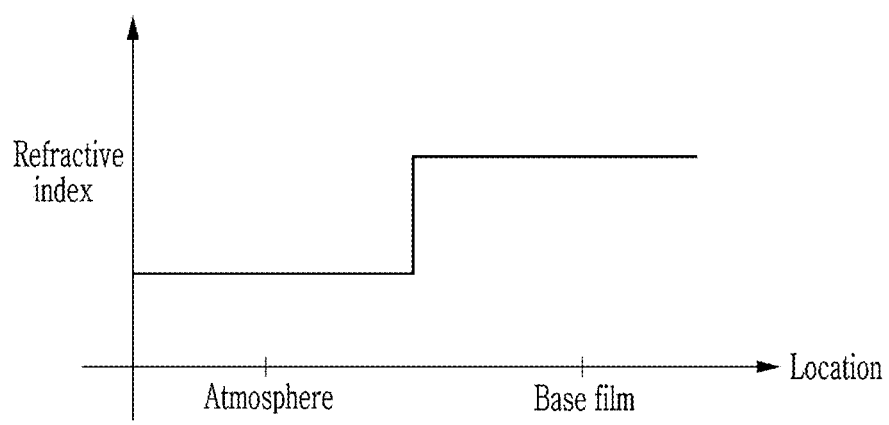
FIG. 8 is a graph that shows a refractive index of a cover window according to a comparative example.
Figure 9:
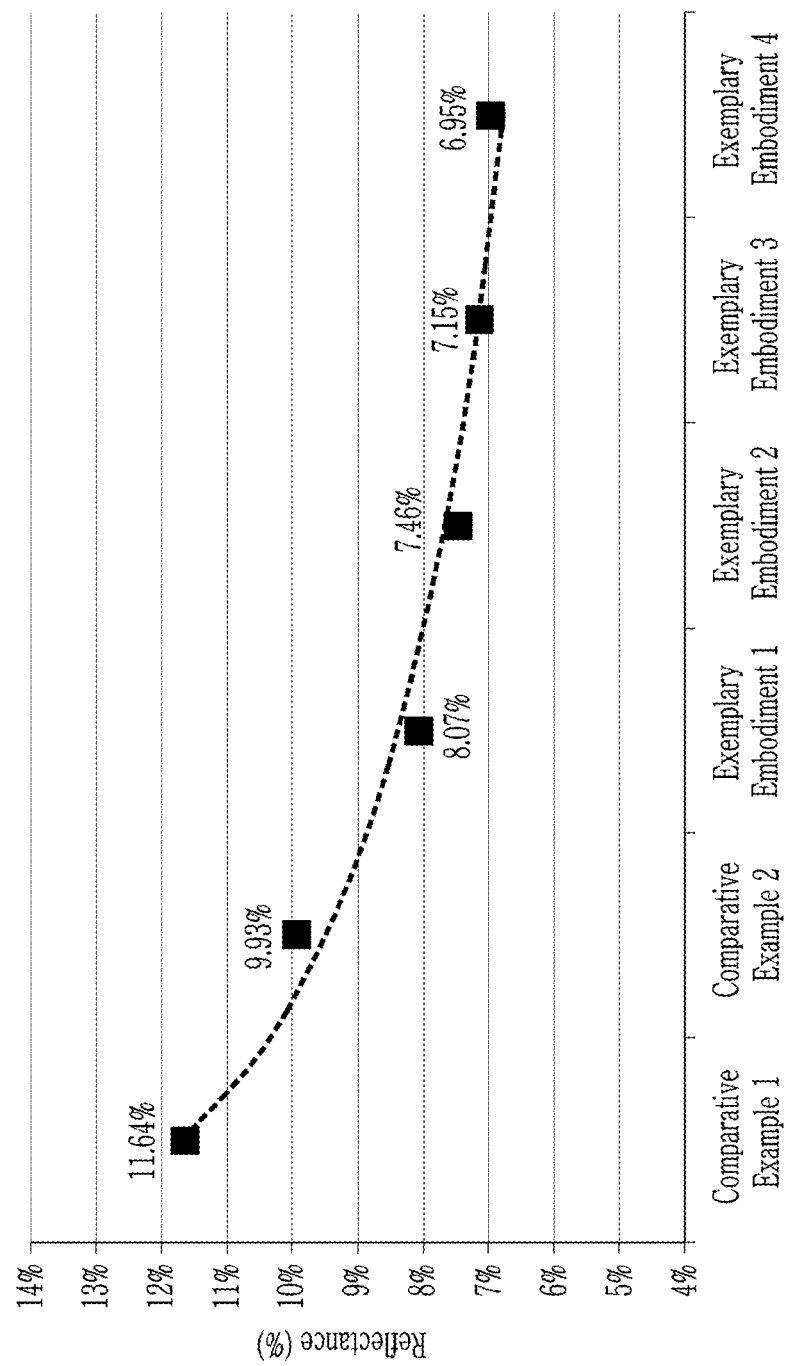
FIG. 9 is a graph that shows reflectance of exemplary embodiments of cover windows according to the invention and a cover window according to comparative examples.

Hereinafter, referring to FIG. 6 to FIG. 9, a refractive index of a cover window and reflectance according to the refractive index according to exemplary embodiments of the invention and comparative examples will be described. FIG. 6 and FIG. 7 are graphs that show a refractive index of exemplary embodiments of the cover window at locations along a thickness thereof according to the invention, FIG. 8 is a graph that shows a refractive index of a cover window along a thickness thereof according to a comparative example, and FIG. 9 is a graph that shows reflectance of exemplary embodiments of cover windows according to the invention and cover windows according to comparative examples.

Referring to FIG. 6, an atmosphere that corresponds to outside of the cover window has a refractive index of about 1. In addition, a first region where the porous nanoparticles are protruded from the base film while contacting the atmosphere has a refractive index of about 1.2 to about 1.5, and a third region where only the base film is disposed has a refractive index of about 1.5 to about 1.7. A second region where the porous nanoparticles are embedded in the base film may have a refractive index between the refractive index of the first region and the refractive index of the third region.

As shown in FIG. 6, the refractive index of the cover window may gradually increase (e.g., continuously or linearly) in a direction from the atmosphere (e.g., outside the cover window) to the third region which is furthest from the atmosphere along a thickness of the cover window. Alternatively, the refractive index of the cover window may be increased along a staircase shape (e.g., stepped) in a direction from the atmosphere to the third region as shown in FIG. 7.

The cover window according to the exemplary embodiments includes the porous nanoparticles so that the refractive index may be differentiated with the cover window, and particularly increased as distance from the atmosphere increases. Specifically, a path through which external light passes from outside the display device and into the display device may be in the order of the porous nanoparticles that contact the atmosphere, the porous nanoparticles that contact the base film, and the base film. With such a light path, a refractive index difference is not particularly significant and the difference in the refractive index between interfaces of the respective layers can be reduced, thereby reducing or effectively preventing a reflection phenomenon. Accordingly, reflection due to external light can be reduced.

As shown in FIG. 8, a cover window according to a comparative example may have a refractive index of about 1.5 to about 1.7 with reference to the atmosphere. The refractive index of the cover window may have a significant difference with a refractive index of the atmosphere, which is 1. Thus, a path through which external light passes from outside the display device, through the cover window of the comparative example and into the display device cause a significant amount of reflection.

Referring to FIG. 9, Comparative Example 1 is a cover window that includes only a base film, and Comparative Example 2 is a cover window that includes a base film and a coating layer. Exemplary Embodiment 1 is a cover window that includes a base film and porous nanoparticles which define a first region, a second region and a third region of the cover window, Exemplary Embodiment 2 is a cover window that further includes a fourth region of which a refractive index is different from Exemplary Embodiment 1, Exemplary Embodiment 3 is a cover window that further includes a fifth region of which a refractive index is different from Exemplary Embodiment 2, and Exemplary Embodiment 4 is a cover window that further includes a sixth region of which a refractive index is different from Exemplary Embodiment 3.

Exemplary Embodiments 1 to 4 show reflectance of about 6.95% to about 8.07%, and Comparative Example 1 and Comparative Example 2 show reflectance of about 9.93% to about 11.64%, each higher than those of the Exemplary Embodiments 1 to 4. Therefore, in one or more exemplary embodiment of the invention, reflectance due to external light being incident on the display device at the cover window thereof can be reduced by the cover window of which the refractive index is gradually changed or differentiated therein.

Hereinafter, impact resistance of the cover window according to an Exemplary Embodiment of the invention will be described with reference to Table 1.

TABLE 1

| Evaluation reference | Comparative Example | Exemplary Embodiment |
|---|---|---|
| Surface reference | 3 cm | 4 cm |
| Bright/Dark point reference | 3 cm | 4 cm |

Referring to Table 1, a pen drop test was performed on a display device of the Comparative Example in which porous nanoparticles are not included in a cover window. As a result, the cover window was damaged at a surface reference of 3 centimeters (cm) and a bright/dark point reference of 3 cm. The same test was performed on a display device of the Exemplary Embodiment in which porous nanoparticles are included in a cover window. As a result, the cover window was damaged at a surface reference of 4 cm and a bright/dark point reference of 4 cm.

According to the Exemplary Embodiment of the invention compared to the Comparative Example, it was determined that the display device of the Exemplary Embodiment that includes the porous nanoparticles in the cover window had improved impact-resistance as compared to the display device of the Comparative Example that does not include the porous nanoparticles in the cover window.

Figure 10:
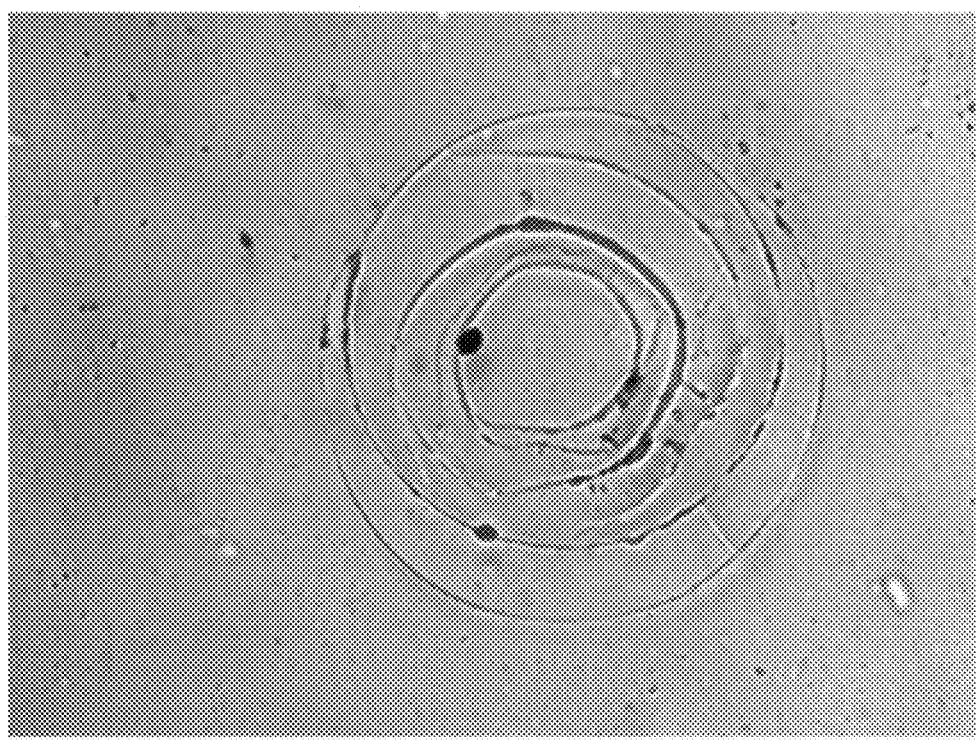
FIG. 10, FIG. 11 and FIG. 12 are images of the cover window according to the comparative example.
Figure 11:
Figure 12:
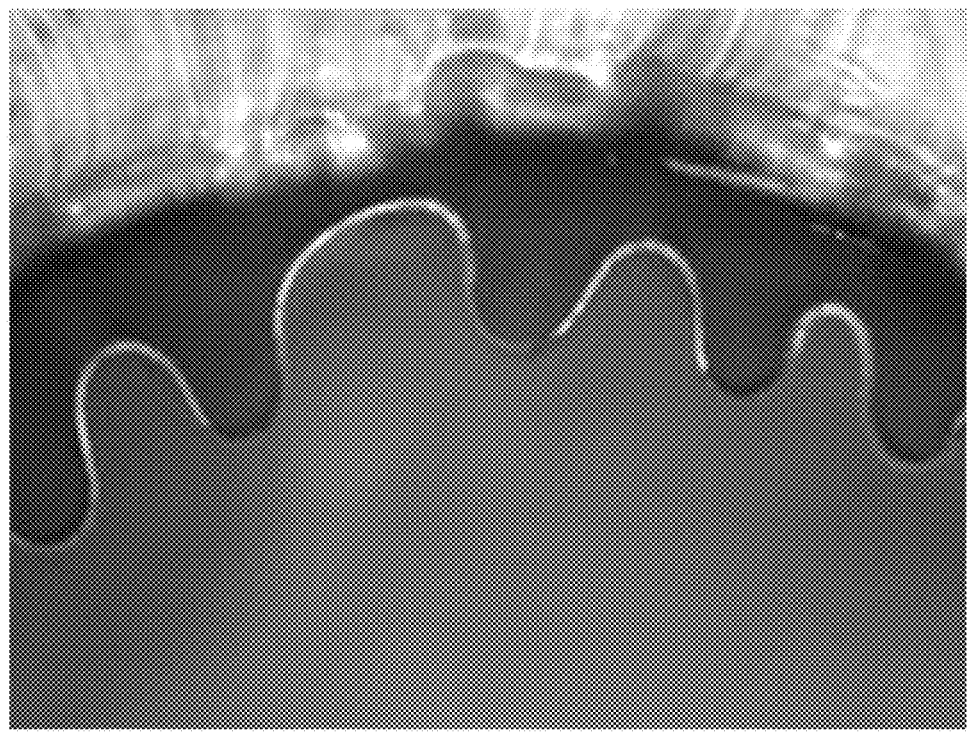

Hereinafter, a cover window according to a Comparative Example will be described with reference to FIG. 10 to FIG. 12. FIG. 10, FIG. 11 and FIG. 12 are images of a cover window according to the Comparative Example. The cover window according to the Comparative Example has a structure in which a separate coating layer is wholly coated on a base film and in which porous nanoparticles are not included.

FIG. 10 shows a result of a pen drop test performed on the Comparative Example and FIG. 11 shows a result of a wear resistance characteristic test on the Comparative Example. As a result, cracks (FIG. 10) due to pen drop easily occur and thus an impact resistance characteristic of the display device is poor, and a significant amount of wear (FIG. 11) occurs in the cover window according to the Comparative Example.

In a conventional display device, a coating layer having relatively high strength can be provided at a cover window of a display device to improve impact resistance and wear resistance thereof. When the cover window of the Comparative Example that includes a coating layer having the relatively high strength was curved, as shown in FIG. 12, lifting occurred between the coating layer and the base film.

The coating layer having the relatively high strength and the base film having flexibility may have a high elasticity difference therebetween. Due to such a difference in properties, there may be a problem that the coating layer is separated from the base film due to the occurrence of a wrinkle defect at the interface between the coating layer and the base film. That is, providing a cover window that satisfies the impact resistance, wear resistance, and flexibility in a cover window in a trade-off relationship, may be difficult according to the conventional display device.

However, one or more exemplary embodiment of the cover window and the display device including the same according to the invention can have improved flexibility through the base film being flexible and can have improve impact resistance and wear resistance through the porous nanoparticles disposed in the cover window.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A cover window comprising:
    a base film attachable to a display panel of a display device; and
    first porous nanoparticles, each including:
        a plurality of pores which exposes an inside of the each of the first porous nanoparticles to outside thereof,
        a first portion thereof which is exposed outside the base film, and
        a second portion thereof which extends from the first portion and through a first outer surface of the base film to be embedded in the base film,
    wherein
    at the second portion of the each of the first porous nanoparticles, a material of the base film extends into the pores of the each of the first porous nanoparticles from outside thereof to directly contact the each of the first porous nanoparticles at the inside thereof, and
    the base film and the second portion of the each of the first porous nanoparticles are bonded to each other as the material of the base film is filled in the plurality of pores of the second portion of the each of the first porous nanoparticles.

2. The cover window of claim 1, wherein the base film contacts opposing sides of the second portion of the each of the first porous nanoparticles.

3. The cover window of claim 1, wherein the base film has elasticity lower than that of the first porous nanoparticles.

4. The cover window of claim 1, wherein a dimension of each of the first porous nanoparticles is about 30 nanometers to about 1 micrometer.

5. The cover window of claim 1, wherein
    along a thickness of the cover window, about 5% to about 90% of a dimension of each first porous nanoparticle is embedded in the base film to define the first portion of the each first porous nanoparticle which is exposed outside the base film.

6. The cover window of claim 1, wherein the cover window further comprises:
    a first thickness region defined by a maximum dimension among the first portions of the first porous nanoparticles;
    a second thickness region defined by a maximum dimension among the second portions of the first porous nanoparticles; and
    a third thickness region where no portion of the first porous nanoparticles is disposed in the base film.

7. The cover window of claim 6, wherein
    the first thickness region, the second thickness region and the third thickness region respectively define refractive indices within the cover window which are different from each other, and
    the refractive indices increase within the cover window in the order of the first thickness region, the second thickness region and the third thickness region thereof.

8. The cover window of claim 6, wherein
    the cover window attached to the display panel disposes the first thickness region, the second thickness region and the third thickness region of the cover window in order along a thickness of the cover window, along a direction toward the display panel,
    a refractive index of the first thickness region is about 1.2 to about 1.5, a refractive index of the third thickness region is about 1.5 to about 1.7, and a refractive index of the second thickness region is greater than the refractive index of the first thickness region and smaller than the refractive index of the third thickness region.

9. A cover window comprising:

a base film attachable to a display panel of a display device;

first porous nanoparticles, each including a first portion thereof which is exposed outside the base film, and a second portion thereof which extends from the first portion and through a first outer surface of the base film to be embedded in the base film; and second porous nanoparticles each being fully embedded in the base film, wherein the cover window attached to the display panel disposes the second porous nanoparticles closer to the display panel than the first porous nanoparticles.

10. A display device comprising:

a display panel which displays an image with light;

a cover window attachable to the display panel and through which the light from the display panel passes to outside the display device, the cover window comprising:

a base film disposed overlapping the display panel which displays the image with the light, first porous nanoparticles each including a first portion thereof which is exposed outside the base film, and a second portion thereof which extends from the first portion and through a first outer surface of the base film to be embedded in the base film, and second porous nanoparticles each including a first portion thereof which is exposed outside the base film, and a second portion thereof which extends from the first portion of the each of the second porous nanoparticles and through a second outer surface of the base film which is opposite to the first outer surface thereof, to be embedded in the base film; and an adhesive layer with which the cover window is attachable to the display panel, wherein the cover window attached to the display panel by the adhesive layer disposes:

the first porous nanoparticles each protruding in a direction away from the display panel from the first outer surface of the base film, to dispose the first portions of the first porous nanoparticles outside of the base film, and the second porous nanoparticles each protruding in a direction toward the display panel from the second outer surface of the base film, to dispose the first portions of the second porous nanoparticles inside of the adhesive layer.

11. The display device of claim 10, wherein the base film contacts opposing sides of the second portion of the each of the first porous nanoparticles.

12. The display device of claim 10, wherein elasticity of the base film is lower than that of the first porous nanoparticles.

13. The display device of claim 10, wherein each of the first porous nanoparticles includes a plurality of pores defined therein, the plurality of pores being exposed to outside the each of the first porous nanoparticles, and at the second portions of the first porous nanoparticles, a material of the base film extends into the pores of the first porous nanoparticles from outside thereof, to contact the first porous nanoparticles in the pores thereof.

14. The display device of claim 10, wherein a dimension of each first porous nanoparticle is about 30 nanometers to about 1 micrometer, and along a thickness of the cover window, about 5% to about 90% of the dimension of the each first porous nanoparticle is embedded in the base film to define the first portion of the each first porous nanoparticle which is exposed outside the base film.

15. The display device of claim 10, wherein the cover window further comprises:

a first thickness region defined by a maximum dimension among the first portions of the first porous nanoparticles;

a second thickness region defined by a maximum dimension among the second portions of the first porous nanoparticles; and a third thickness region where no portion of the first porous nanoparticles is disposed in the base film, wherein the cover window attached to the display panel by the adhesive layer disposes the second thickness region is-closer to the display panel than the first thickness region and the third thickness region is-closer to the display panel than the second thickness region.

16. The display device of claim 15, wherein the first thickness region, the second thickness region and the third thickness region respectively define refractive indices within the cover window which are different from each other, and the refractive indices increase within the cover window in the order of the first thickness region, the second thickness region and the third thickness region thereof.

17. The display device of claim 15, wherein the cover window attached to the display panel by the adhesive layer disposes the first thickness region, the second thickness region and the third thickness region of the cover window in order along a thickness of the cover window, along a direction toward the display panel, a refractive index of the first thickness region is about 1.2 to about 1.5, a refractive index of the third thickness region is about 1.5 to about 1.7, and a refractive index of the second thickness region is greater than that of the first thickness region and smaller than that of the third thickness region.

18. The display device of claim 10, wherein the cover window further comprises third porous nanoparticles each being fully embedded in the base film.

* * * * *